United States Patent
Bedeschi

(10) Patent No.: US 9,330,756 B2
(45) Date of Patent: May 3, 2016

(54) APPARATUSES AND METHODS FOR SENSING USING AN INTEGRATION COMPONENT

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/458,813

(22) Filed: Aug. 13, 2014

(65) Prior Publication Data

US 2016/0049194 A1 Feb. 18, 2016

(51) Int. Cl.
*G11C 11/00* (2006.01)
*G11C 13/00* (2006.01)

(52) U.S. Cl.
CPC .............. *G11C 13/004* (2013.01); *G11C 11/00* (2013.01)

(58) Field of Classification Search
USPC .................................. 365/148, 163, 145, 157
See application file for complete search history.

(56) References Cited

U.S. PATENT DOCUMENTS

| | | | |
|---|---|---|---|
| 6,795,359 B1* | 9/2004 | Baker | 365/209 |
| 7,136,300 B2 | 11/2006 | Tran et al. | |
| 7,436,698 B2 | 10/2008 | Lin et al. | |
| 8,238,145 B2 | 8/2012 | Abedifard | |
| 8,320,169 B2 | 11/2012 | Zhu et al. | |
| 8,929,125 B2* | 1/2015 | Keeth et al. | 365/148 |
| 2007/0171698 A1* | 7/2007 | Hoenigschmid et al. | 365/148 |
| 2009/0219756 A1* | 9/2009 | Schroegmeier et al. | 365/163 |
| 2012/0106239 A1 | 5/2012 | Xi et al. | |

* cited by examiner

*Primary Examiner* — Vu Le
(74) *Attorney, Agent, or Firm* — Brooks, Cameron & Huebsch, PLLC

(57) ABSTRACT

The present disclosure includes apparatuses and methods for sensing a resistance variable memory cell. A number of embodiments include circuitry to provide a programming signal to a memory cell in the array, the programming signal associated with programming the memory cell to a particular data state; and determine, via an integration component, if a data state of the memory cell changes to a different data state responsive to the programming signal being provided.

23 Claims, 5 Drawing Sheets

APPARATUSES AND METHODS FOR SENSING USING AN INTEGRATION COMPONENT

TECHNICAL FIELD

The present disclosure relates generally to apparatuses, such as semiconductor memory devices, systems, and controllers, and related methods, and more particularly, in an example embodiment to sensing resistance variable memory cells.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, phase change random access memory (PCRAM), resistive random access memory (RRAM), magnetoresistive random access memory (MRAM; also referred to as magnetic random access memory), conductive-bridging random access memory (CBRAM), and spin torque transfer random access memory (STT RAM), among others.

Non-volatile memory may be used in, for example, personal computers, portable memory sticks, solid state drives (SSDs), personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in non-volatile memory devices.

Resistance variable memory, such as RRAM or STT RAM, includes resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by providing (e.g., applying, generating, inputting, outputting, passing, etc.) a programming signal to the resistance variable memory cells. Providing a programming signal can include applying a source of an electrical field or energy, such as positive or negative electrical pulses (e.g., positive or negative voltage or current pulses) to the cells (e.g., to the memory element of the cells) for a particular duration.

A resistance variable memory cell can be programmed to one of a number of data states. For example, a single level cell (SLC) may be programmed to one of two data states, a low resistance state that corresponds to a parallel state (e.g., logic 0), or a high resistance state that corresponds to an anti-parallel state (e.g., logic 1). The data state of the memory cell can depend on whether the cell is programmed to a resistance above or below a particular level. As an additional example, various resistance variable memory cells can be programmed to one of multiple different data states corresponding to different resistance states. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

In some instances, a sensing operation used to determine the data state of a resistance variable memory cell can incorrectly determine the data state of the resistance variable memory cell. For example, a signal associated with the memory cell during a sensing operation may or may not correspond to a data state to which the memory cell was programmed, thus resulting in sensing an incorrect data state for the memory cell.

DETAILED DESCRIPTION

Figure 1:
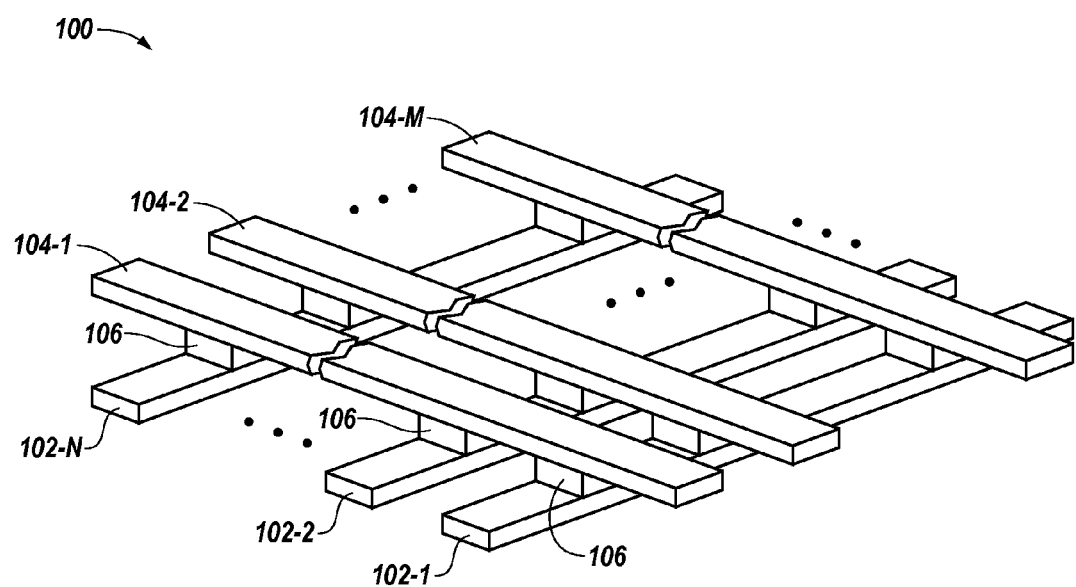
FIG. 1 is a block diagram of a portion of an array of resistance variable memory cells according to a number of embodiments of the present disclosure.

The present disclosure includes apparatuses and methods for sensing a memory cell. A number of embodiments include circuitry to provide a programming signal to the memory cell in the array. The programming signal may be associated with programming the memory cell to a particular data state. The circuitry may also determine, via an integration component, if a data state of the memory cell changes to a different data state responsive tithe programming signal being provided (e.g., during application of the programming signal).

In a number of embodiments, a change in a signal associated with the memory cell can be determined (e.g., detected) during the application of the programming signal. A change in the signal may be determined due to the memory cell changing its data state in response to the applied programming signal, or the change in the signal may be determined due to, for example, unpredictable circuitry noise (e.g., sensing glitches) causing short voltage spikes in a signal associated with the programming signal In a number of embodiments, an integration component can be used to determine if the change in the signal was due to the memory cell changing data states in response to the applied programming signal (as opposed to, for example, sensing glitches while applying the programming signal).

Embodiments described herein can, for example, reduce sensing (e.g., reading) errors and/or increase the speed of a sensing operation as compared to previous approaches. For example, sensing operations in previous approaches can result in sensing errors due to, for example, circuit noise affecting the sensing operation. Also, to avoid such sensing errors, some previous approaches use a time consuming number of steps to determine the data state of a memory cell. For example, some previous approaches sense the data state of a memory cell, program the memory cell to a known data state, and sense the data state of the memory cell again to determine the initial data state of the memory cell. Embodiments of the present disclosure are believed to sense memory cells with increased speed and/or with fewer errors than previous approaches.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "N" and "M", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 250 may reference element "50" in FIG. 2, and a similar element may be referenced as 450 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a block diagram of a portion of an array 100 of resistance variable memory cells 106 according to a number of embodiments of the present disclosure. In the example illustrated in FIG. 1, array 100 is a cross-point array having resistance variable memory cells 106 located at the intersections of a first number of conductive lines 102-1, 102-2, ..., 102-N (e.g., access lines, which may be referred to herein as word lines), and a second number of conductive lines 104-1, 104-2, ..., 104-M (e.g., data/sense lines, which may be referred to herein as bit lines). As illustrated in FIG. 1, word lines 102-1, 102-2, ..., 102-N are substantially parallel to each other and are substantially orthogonal to bit lines 104-1, 104-2, ..., 104-M, which are substantially parallel to each other; however, embodiments are not so limited. In the embodiment illustrated in FIG. 1, resistance variable memory cells 106 can function in a two-terminal architecture (e.g., with a particular word line 102-1, 102-2, ..., 102-N and bit line 104-1, 104-2, ..., 104-M serving as a bottom and top electrode for the cell 106).

Each resistance variable memory cell 106 can include a storage element (e.g., a resistance variable memory element) coupled (e.g., in series) to a select device (e.g., an access device). The access device can be, for example, a diode or a transistor (e.g., a field effect transistor (FET) or bipolar junction transistor (BJT)), among others. The storage element can include a programmable portion that may have a variable resistance, for example. The memory cell 106 can be a spin torque transfer random access memory (STT RAM) cell and include magnetic tunnel junction, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistance variable memory cells 106 can include various materials employing trapped charges to modify or alter conductivity, chalcogenides formed of various doped or undoped materials, binary metal oxide materials, colossal magnetoresistive materials, and/or various polymer based resistance variable variable materials, among others. Embodiments are not limited to a particular resistance variable material or materials. As such, resistance variable memory cells 106 can be single level and/or multilevel resistive random access memory (RRAM) cells, spin torque transfer random access memory (STT RAM) cells, programmable conductor memory cells, phase change random access memory (PCRAM) cells, magnetoresistive random access memory (MRAM) cells, and/or conductive-bridging random access memory (CBRAM) cells, among various other types of resistance variable memory cells.

In operation, resistance variable memory cells 106 of array 100 can be programmed via programming signals (e.g., write voltage and/or current pulses) applied to the cells (e.g., the storage element of the cells) via selected word lines 102-0, 102-1, ..., 102-N and bit lines 104-0, 104-1, ..., 104-M. The magnitude (e.g., amplitude), duration (e.g., width), and/or number of programming pulses, for example, applied to resistance variable memory cells 106 can be adjusted (e.g., varied) in order to program the cells to one of a number of different resistance states corresponding to particular data states.

In a number of embodiments, a single level resistance variable memory cell may be programmed to one of two data states (e.g., logic 1 or 0). The memory cell may be programmed with a first programming signal, which will place the cell in a low resistance data state (e.g., logic 0) or the memory cell may be programmed with a second programming signal, which will place the cell in a relatively higher resistance data state (e.g., logic 1). In a number of embodiments, the difference in resistance between the low data resistance state and the high resistance data state of a memory cell can be referred to as the reading window. For example, a memory cell in the high resistance data state can have a resistance that is 10 times more that the resistance of the memory cell in the low resistance data state, therefore the reading window for the memory cell can be 10 times the low resistance level. Embodiments in the present disclosure are not limited to a particular reading window and the reading window can include a number of differences in resistance between a high resistance data state and a low resistance data state.

A sensing (e.g., read and/or program verify) operation can be used to determine the data state of a resistance variable memory cell 106 (e.g., the resistance state of the storage element of a resistance variable memory cell 106) by sensing (e.g., read) a characteristic of a signal, for example, on a bit line 104-0, 104-1, ..., 104-M associated with the respective cell responsive to a particular voltage applied to the selected word line 102-0, 102-1, ..., 102-N to which the selected cell is coupled. Sensing can include sensing a change in voltage, current, amplitude, and/or slope (e.g. a time derivative of a parameter of the signal) of a signal associated with the respective cell, among other characteristics of the signal. In a number of embodiments where a memory cell includes a 3-terminal select device, a word line voltage can be used to select the memory cell and a characteristic of a signal associated with the memory cell (e.g., bit line voltage) can change based on the resistance level of the memory cell, for example. A sensing operation can incorrectly determine the data state of a resistance variable memory cell when a change in such a characteristic is determined to be due to, for example, a sensing glitch caused by circuit noise (as opposed to being due to a change in the resistance of the cell).

A sensing operation according to a number of embodiments of the present disclosure can reduce sensing errors associated with a cell having a resistance associated with two or more data states and/or decrease the time to perform a sensing operation. Previous approaches included sensing operations that resulted in sensing errors or sensing operations that resulted in reduced sensing errors, but involved a number of time intensive steps (e.g., such as those that included two sensing operations and a programming operation to determine the data state of the memory cell). In a number of embodiments, a method for sensing a resistance variable memory cell can include providing (e.g., applying) a programming signal to the memory cell and determining the data state of the memory cell by determining whether a signal associated with the memory cell has a characteristic (e.g., voltage and/or length of time, among other characteristics) that meets a particular threshold. An integration component can be used to determine if a change in a signal associated with the memory cell was actually due to the memory cell changing data states. For example, determining the data state of the memory cell can include determining whether a change in a signal associated with the memory cell happens for less than a threshold amount of time or happens for greater than or equal to the threshold amount of time.

FIG. 2 illustrates a block diagram of components for determining a data state of a resistance variable memory cell according to a number of embodiments of the present disclosure. A signal generator 214 can provide a programming signal used to program memory cells to a particular data state. The programming signal can be ramped through a number of currents and/or voltages used to program memory cells to the particular data state. As a result of providing the programming signal to memory cell 206a signal ($S_{in}$) 212-1 associated with memory cell 206 is provided on bit line 204. A change in signal 212-1 can be determined using circuitry, such as that described in association with FIG. 2, and used to determine a data state of the memory cell 206.

Signal 212-1 can be provided (e.g., input) to a voltage buffer 210 and a high pass filter 220. The voltage buffer 210 can drive the high pass filter without loading bit line 204 with additional capacitances. Signal 212-1 can pass through the voltage buffer 210 to provide (e.g., pass) signal 212-2 (S2). Signal 212-2 can pass through high pass filter 220 to provide signal 212-3 (S3). Signal 212-3 can be provided from the high pass filter 220 to a DC voltage generator 240 to provide (e.g., generate) a DC signal 212-4 (S4), which is equal to signal 212-3. Signal 212-3 is sampled by circuitry 230 to provide (e.g., generate) a reference signal 212-5 (S5). The high pass filter 220 superimposes an AC signal to signal 212-3 and signal 212-4 during the programming signal as a result of the change of the resistance from a high resistive state to a low resistive state. Signal 212-4 can be provided from the DC voltage generator 240 to a comparison component 250 that can include circuitry comprising a pre-amplifier, a comparator, and/or other circuitry including some reset logic. DC voltage generator 240 can include, for example, an inverter that is closed at its trip point where its input, signal 212-3, is short-circuited to its output, signal 212-4, to provide a DC signal 212-4, that is equal to the input signal 212-3.

Circuitry 230 can include a filter, a capacitance, and a number of switches. In a number of embodiments, the filter, the capacitance, and the number of switches can be used to filter out noise from the signal 212-3 as the signal from signal generator 214 is initially provided to memory cell 206, thus providing signal 212-1. In a number of embodiments, signal 212-3 can be sampled on the capacitance during a first time period via the opening and closing of a number of switches, thus providing the signal 212-5, which is a reference replica to be used by the comparison component 250 in a subsequent second time period against the signal 212-4 (which is the superimposition of an AC signal to a DC signal). If a change in the resistance of the memory cells 206 happens during a second period, the corresponding AC signal is large enough to make signal 212-4 be different from its sampled reference replica 212-5 stored during a first period, thus becoming a large enough detectable input by the comparison component 250, whose output will change from a first state (e.g., approximately 0 V) to a second state (e.g., approximately Vcc). This will happen for a particular time period that the change in resistance will take, mostly depending on characteristic RC time constants of the bitlines, and until the change itself is fully determined by the proper comparison component 250. If no change in the resistance of the memory cells 206 happens along with the whole programming signal, the AC signal is small enough or equal to zero, thus leaving signal 212-4 to be very close to or equal to the signal 212-5 sampled at a first time. Signal 212-4 and signal 212-5 provided to the comparison circuitry 250 would have a difference that is undetectable and the comparison circuitry 250 would have its output remain at approximately 0 V. For instance, the amplitude of the AC voltage signal 212-1 is basically determined by the product Rcell(t)*I, where I is the applied programming current from signal generator 214 and Rcell is the cell resistance at a given time t; if the Rcell(t) changes from high resistance state to low resistance state Rcell(t+dt), where Rcell(t+dt) is typically close to half of Rcell(t), a voltage drop of about ½*Rcell(t)*I is suddenly happening on top of a stable bit line voltage level, thus generating the AC signal. This AC signal 212-2 is then transferred through the high pass filter 220, which outputs signal 212-3 and then superimposed to the DC signal level of signal 212-4, which stops the stable bit line voltage level. Also, changes in the signal associated with the memory cell that occur responsive to the programming signal being provided may be due to sensing glitches that cause a spike in the voltages which are applied to the comparator component inputs, signals 212-4 and 212-5. These glitches, which may be mainly due to noise events, are AC signals superimposed to the DC values as well, but their duration is much smaller that the particular duration of an AC signal properly generated by a change in the resistance of the memory cells. For example, a particular RC of the bitline when the resistance is changing due a programming signal is about 5 nanoseconds (nS) to 10 nS, while a voltage spike due to a noise event may be in the range of 1 nS to 2 nS.

In a number of embodiments, the comparison component 250 can include circuitry to determine resistance changes in memory cell 206. Signal (Sout) 212-6 can be provided by the comparison component 250, wherein signal 212-6 can be in a first state (e.g., approximately 0 V) during the time period that a resistance change is not determined and no AC signal is generated, and can be in a second state (e.g., approximately Vcc) during the time period an AC signal is generated if a resistance change is determined when the programming signal is applied to the memory cells 206. The comparison component 250 can determine changes in the resistance of the memory cell 206 based on the inputs from the DC voltage generator 240 and circuitry 230. The comparison component 250 can provide an output signal (Sout) 212-6 that corresponds to a determined change in resistance of the memory cells.

Figure 2A:
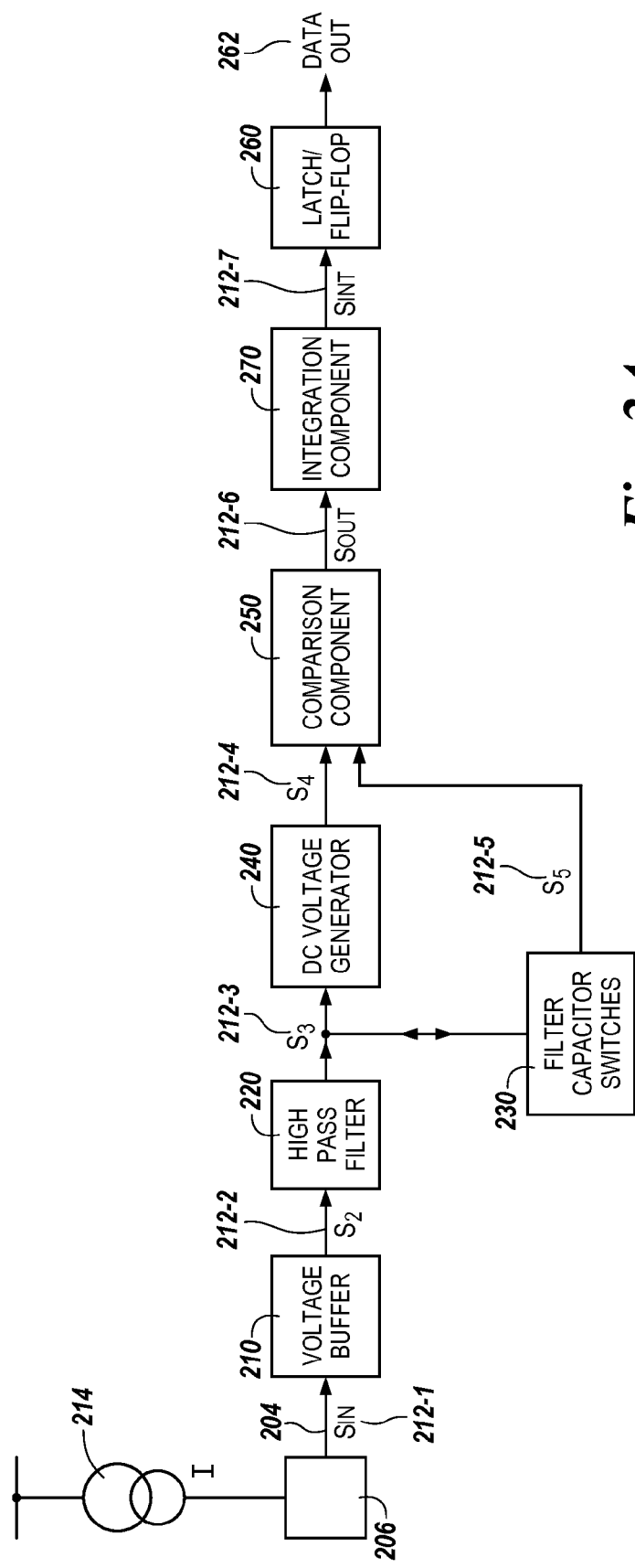
FIGS. 2A and 2B illustrate block diagrams of components for determining a data state of a resistance variable memory cell according to a number of embodiments of the present disclosure.

In FIG. 2A, the output from comparison component 250 is signal (Sout) 212-6, which can be provided to integration component 270. Integration component 270 relies on the time duration of the AC signals, and thus the time duration of the Sout signal, to determine if a change determined by comparison component 250 was actually due to a change in data state of the memory cells 206. As shown in FIG. 2A, integration component 270 can output signal (Sint) 212-7, which can be input into latch and/or flip-flop 260 to determine the data state of the memory cell. The output 262 (Data Out) of latch and/or flip-flop 260 can indicate whether the data state of the memory cell changed responsive to the application of the programming signal to the memory cell 206. For instance, output 262 can be set to a data state 1 by the integration component 270 from an initial data state 0 (where the initial data state 0 was a result of a previously issued reset) if the duration of its input pulse Sout is long enough (5 nS to 10 nS, for example) to generate a proper high enough Sint value (e.g., a voltage close enough to Vcc). As such, if the output 262 indicates the data state changed, the memory cell can be reprogrammed to its initial data state. Output 262 can be set to data state 0 by the integration component 270, unchanged from the initial data state 0, if the memory cell did not change it initial data state or if the duration of its input pulse Sout is short enough (1 nS to 2 nS, for example) not to generate a proper and high enough Sint value (e.g., if a voltage close to 0 was generated).

Figure 2B:
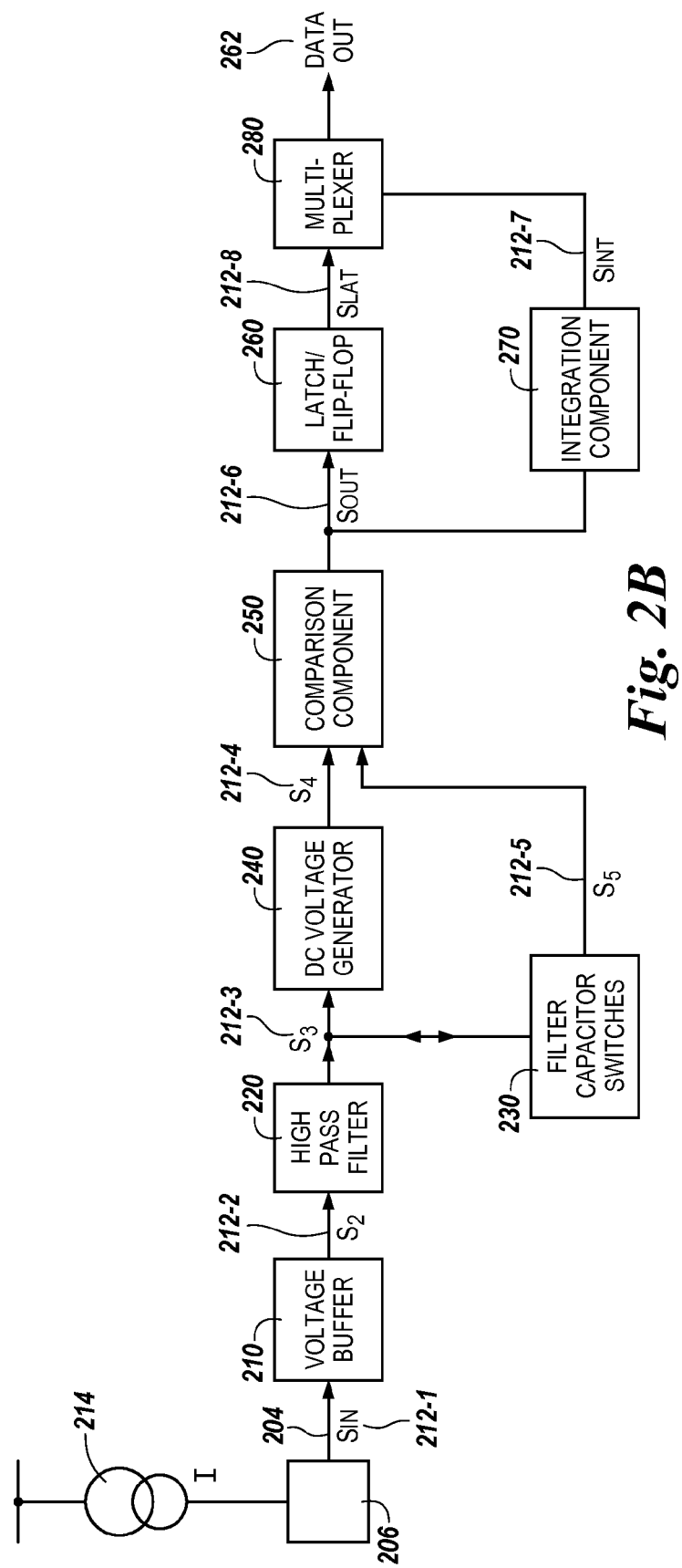

In FIG. 2B, the output from comparison component 250 is signal (Sout) 212-6 and can be input into integration component 270 and into latch/flip-flop 260. The latch/flip-flop 260 can output signal (Slat) 212-8, which can indicate whether the resistance of the memory cell changed during the application of the programming signal to the memory cell 206. For instance, signal 212-8 can be set to correspond to data state 1 from an initial data state 0 if a change in resistance of the memory cell was determined by comparison component 250 or signal 212-8 can be set to correspond to data state 0 if a change in resistance of the memory cell was not determined by comparison component 250. The signal 212-8 corresponding to a data state of the memory cell can be input into multiplexer 280 and verified or invalidated by signal (Sint) 212-7, which is input from integration component 270 to multiplexer 280. As shown in FIG. 2B, integration component 270 can output signal (Sint) 212-7, which can be input into multiplexer 280 to determine the data state of the memory cell. Integration component 270 can output signal 212-7 corresponding to data state 1 when signal 212-6 was applied to integration component 270 for at least a threshold amount of time. Signal 212-7 corresponding to data state 1 can be input into multiplexer 280 resulting output 262 from the multiplexer to correspond to data state 1. Integration component 270 can output signal 212-7 corresponding to data state 0 when signal 212-6 was applied to integration component 270 for less than a threshold amount of time. Signal 212-7 corresponding to data state 0 can be input into multiplexer 280, which verifies that an input 212-8 corresponding to data state 0 was correct or invalidates an input signal 212-8 corresponding to data state 1, resulting in output 262 from the multiplexer corresponding to data state 0. The output 262 (Data Out) of multiplexer 280 can indicate whether the data state of the memory cell changed due to the application of the programming signal to the memory cell 206. As such, if the output 262 indicates the data state changed, the memory cell can be reprogrammed to its initial data state. Also, output 262 can be set to data state 0 by the integration component 270, unchanged from the initial data state 0.

A number of embodiments can use a number of circuitry configurations to determine resistance changes in memory cell 206. The number of embodiments can include using a number of inverters and/or comparators to determine resistance changes in a memory cell. Embodiments of the present disclosure are not limited to such circuitry configurations to determine resistance changes in the memory cells.

In an example in which the memory cell is an STT memory cell, the particular programming signal can be a programming signal used to program the memory cell to a parallel state. An occurrence of a change in the resistance of the memory cell may be determined if the initial data state of the memory cell is an anti-parallel data state and the particular programming signal is a programming signal used to program memory cells to a parallel state; therefore, determining that a change in the resistance of the memory cell occurred for at least a threshold amount of time would indicate that the initial data state of the memory cell was not parallel data state, but was the anti-parallel data state. A determined change in resistance of the memory cell for at least a threshold amount of time can indicate a data state change for the memory cell during the application of the programming signal. Therefore the memory cell can then be programmed back to its initial data state. For example, a programming signal associated with programming memory cells to the anti-parallel data state can be applied to the memory cell to return the memory cell to the initial data state.

For example, during implementation of the embodiments illustrated in FIGS. 2A and 2B, the particular programming signal can be incrementally ramped through a number of programming signal values that are used to program memory cells to the particular data state. The particular programming signal can be incrementally ramped until a determination that a change in the resistance (e.g., current and/or voltage associated with the memory cell) of the memory cell occurred for at least a threshold amount of time, a maximum programming signal value is reached, or a maximum time period for applying the particular programming signal is reached.

Figure 3:
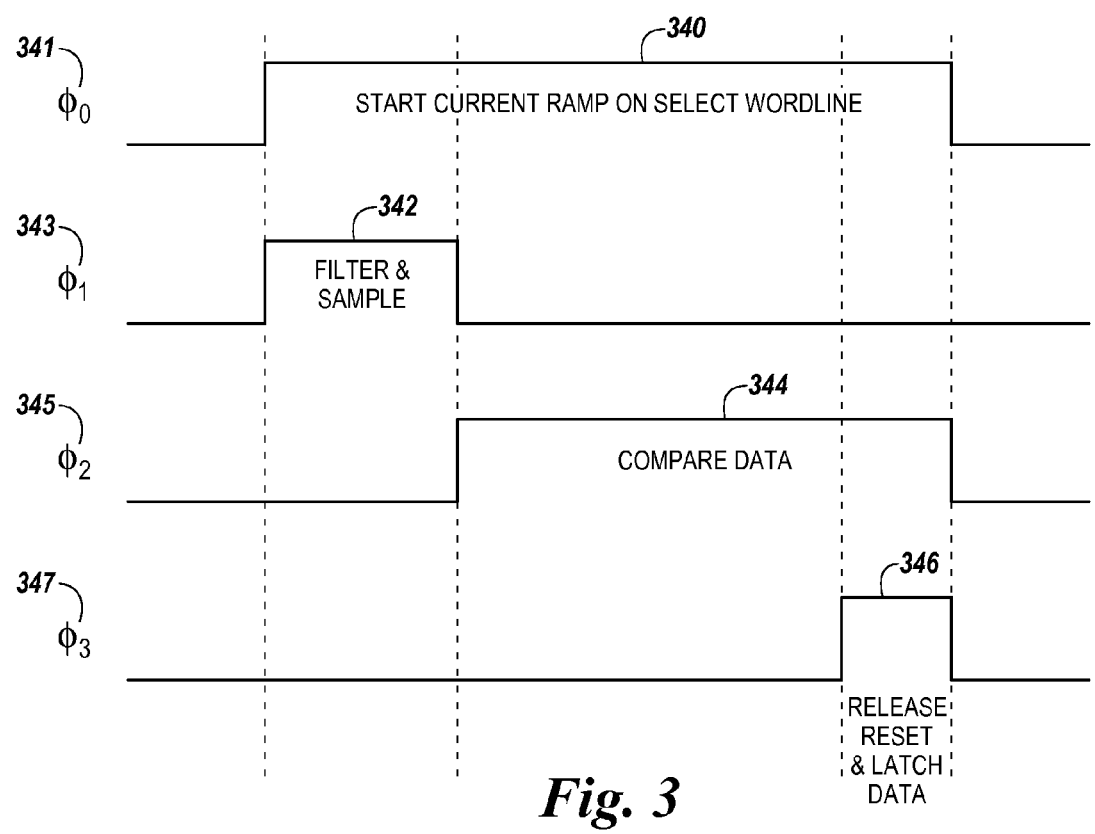
FIG. 3 illustrates a chart indicating the phases in determining a data state of a resistance variable memory cell according to a number of embodiments of the present disclosure.

FIG. 3 illustrates a chart indicating the phases in determining a data state of a resistance variable memory cell according to a number of embodiments of the present disclosure. In FIG. 3, a first phase ($\phi_0$) 341 includes applying a programming signal to a memory cell by starting a current ramp. The programming signal can be incrementally ramped through a number of programming signal values that are used to program memory cells to a particular data state. The programming signal can be applied for a time period 340 during the first phase 341. The particular programming signal can be incrementally ramped until a determination that a change in the voltage associated with the memory cell occurred, a maximum programming signal value is reached, or a maximum time period for applying the particular programming signal is reached, e.g., time period 340.

In FIG. 3, a second phase ($\phi_1$) 343 includes filtering and sampling a signal associated with a memory cell. The signal can be filtered and sampled using circuitry, e.g., circuitry 230 in FIG. 2. The signal can be filtered and sampled during a time period 342. Time period 342 can be during a first portion of time period 340.

In FIG. 3, a third phase ($\phi_2$) 345 includes comparing signals to determine the data state of a memory cell. Comparing signals to determine the data state of the memory cell can be completed by using circuitry, e.g., comparison component 250 and/or integration component 270 in FIGS. 2A and/or 2B. Signals can be compared during a time period 344. Time period 344 can be during a second portion of time period 340 and after time period 342.

In FIG. 3, a fourth phase ($\phi_3$) 347 includes the release of the reset of the latch and the enable of the latch to store the data state of the memory cell. Resetting the latch should be completed during time period 340 and before time period 346 which is used to store the data state. Time period 346 can start during a third portion of time period 340 and end during the end of time period 344.

Figure 4:
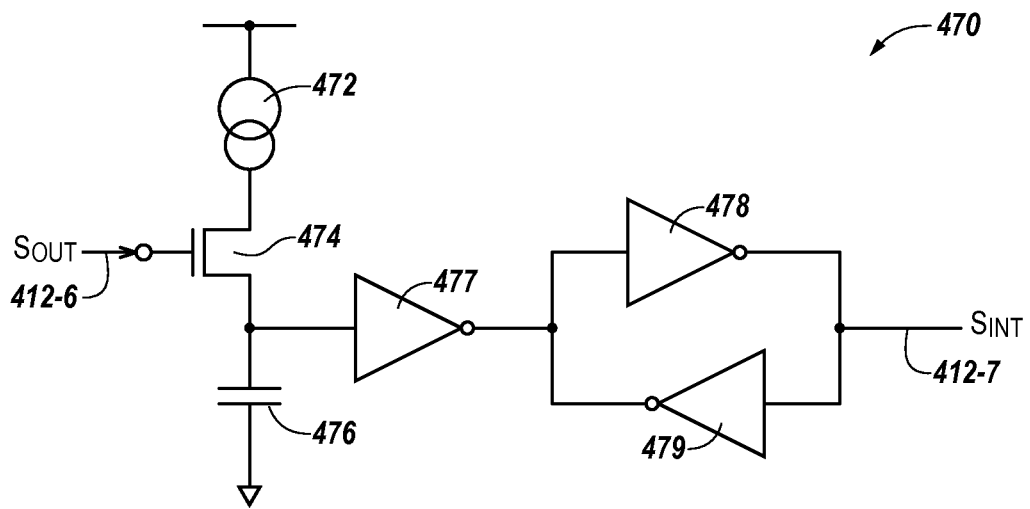
FIG. 4 illustrates circuitry of an integration component for determining a data state of a resistance variable memory cell according to a number of embodiments of the present disclosure.

FIG. 4 illustrates circuitry of an integration component 470 for determining a data state of a resistance variable memory cell according to a number of embodiments of the present disclosure. The integration component 470 can include circuitry comprising of a constant current generator 472, an select device 474, a capacitance 476 (which can be a parasitic capacitance and/or a discrete capacitor), and inverters 477, 478, and 479, and some logic to reset the latch (not shown) (e.g., a pull down transistor with its drain connected to the input of 477, the source connected to ground and the gate coupled to a reset signal).

The integration component 470 can be configured so that signal 412-6 from a comparison component is applied to the select device. Signal 412-6 is the signal from the comparison component that determines a change in resistance of the memory cell while a programming signal is applied to the memory cell. Signal 412-6 can be approximately 0 V when the comparison component does not determine a change in resistance of the memory cell while the programming signal is applied to the memory cell. Signal 412-6 can be approximately at Vcc when the comparison component determines a change in resistance of the memory cell while the programming signal is applied to the memory cell. Signal 412-6 being at Vcc, however, may or may not be due the memory cell changing data states as described above. Integration component 470 can be used to determine if the data state of the memory cell changes when the programming signal is applied to the memory cell based on the amount of time that a change in resistance is determined by the comparator component.

In FIG. 4, signal 412-6 is applied to select device 474. The select device 474 is turned off and the constant current generator 472 is not charging capacitance 476 when signal 412-6 is approximately 0 V (e.g., indicating that the comparison component is not determining a change in resistance of the memory cell). The select device 474 is turned on and the constant current generator 474 is charging capacitance 476 when signal 412-6 is at approximately Vcc (e.g., indicating that the comparison component is determining a change in resistance of the memory cell). The integration component 470 includes a number of inverters 477, 478, and 479 that are configured to output signal 412-7 to indicate the data state of the memory cell. Signal 412-7 can indicate the data of state of the memory cell changed based on the capacitance reaching a charge that is above a threshold amount (e.g., voltage), therefore the select device 474 was turned on by signal 412-6 for at least a threshold amount of time to charge the capacitance 476 above a threshold amount, which indicates the AC signal determined by the comparison component was due to the memory cell changing data states. Signal 412-7 can indicate the data state of the memory cell did not change when the capacitance reaches a charge that is below a threshold amount (e.g., voltage), therefore the select device 474 was not turned on by signal 412-6 for at least a threshold amount of time to charge the capacitance 476 to a charge above a threshold amount, which indicates the comparison component did not determine an AC signal related to a change in resistance of the memory cell or the AC signal determined by the comparison component was due to the sensing glitches produced by some noise events while performing the programming operation on the memory cell. Signal 412-7 can correspond to data state 1 when the capacitance reaches a charge that is greater or equal to a threshold amount and signal 412-7 can correspond to data state 0 when the capacitance reaches a charge that is less than a threshold amount.

Figure 5:
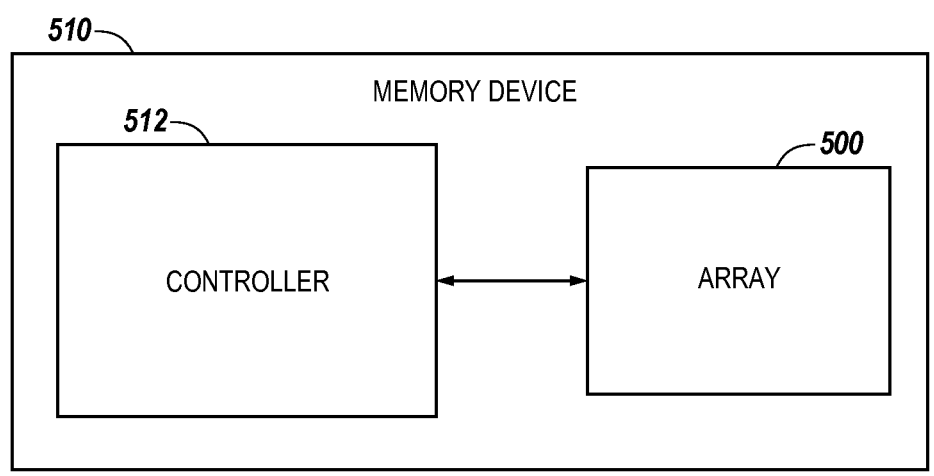
FIG. 5 illustrates a block diagram of an apparatus in the form of a memory device according to a number of embodiments of the present disclosure.

FIG. 5 illustrates a block diagram of an apparatus in the form of a memory device 510 according to a number of embodiments of the present disclosure. As shown in FIG. 5, memory device 510 includes a controller 512 coupled to a memory array 500. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Memory array 500 can be analogous to, for example, memory array 100 previously described in connection with FIG. 1. Although one memory array is shown in FIG. 5, embodiments of the present disclosure are not so limited (e.g., memory device 510 can include more than one memory array coupled to controller 512).

Controller 512 can include, for example, control circuitry and/or firmware. Controller 512 can be included on the same physical device (e.g., the same die) as memory array 500, or can be included on a separate physical device that is communicatively coupled to the physical device that includes memory array 500. For example, controller 512 can be a controller of an array testing apparatus (e.g., a controller used to perform testing operations on memory arrays such as array 500).

In this example, controller 512 includes control circuitry and/or firmware to determine changes in resistance of memory cells in array 500. The control circuitry and/or firmware can be included on the same physical device (e.g., the same die) as memory array 500, or can be included on a separate physical device that is communicatively coupled to the physical device that includes memory array 500. The control circuitry and/or firmware can be the circuitry illustrated in and described in association with FIGS. 2-6.

Controller 512 can apply a number of signals in accordance with a number of embodiments of the present disclosure to the memory cells (e.g., to the storage elements of the memory cells) in memory array 500. For example, controller 512 can apply a programming signal previously described in connection with FIG. 1 to the storage element of the memory cells in memory array 500.

The embodiment illustrated in FIG. 5 can include additional circuitry that is not illustrated so as not to obscure embodiments of the present disclosure. For example, memory device 510 can include address circuitry to latch address signals provided over I/O connectors through I/O circuitry. Address signals can be received and decoded by a row decoder and a column decoder, to access memory array 500. As an additional example, memory device 510 can include sense (e.g., read) circuitry.

The present disclosure includes apparatuses and methods for sensing a memory cell. A number of embodiments include circuitry to provide a programming signal to the memory cell. The programming signal may be associated with programming the memory cells to a particular data state. The circuitry may also determine, via an integration component, if a data state of the memory cell changes to a different data state responsive to the programming signal being provided (e.g., during application of the programming signal).

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of resistance variable memory cells; and
circuitry configured to:
provide a programming signal to a memory cell in the array, the programming signal associated with programming the memory cell to a particular data state; and
determine, via an integration component, if a data state of the memory cell changes to a different data state responsive to the programming signal being provided to the memory cell, wherein a comparison component is configured to provide a signal associated with a resistance of the memory cell to the integration component.

2. The apparatus of claim 1, wherein the signal provided by the comparison component is at a first state when the resistance of the memory cell remains unchanged from an initial resistance.

3. The apparatus of claim 2, wherein the signal provided by the comparison component is at a second state when the resistance of the memory cell is changed from an initial resistance.

4. The apparatus of claim 3, wherein the integration component provides a signal indicating the data state of the memory cell based on an amount of time that the signal provided by the comparison component is at the second state.

5. The apparatus of claim 1, wherein the integration component is configured to charge a capacitance responsive to the signal provided by a comparison component being in an active state.

6. The apparatus of claim 1, wherein the integration component is configured to determine that the data state of the memory cell changed to the different data state responsive to a signal provided by a comparison component being in an active state and a capacitance being charged to at least a threshold amount.

7. The apparatus of claim 1, wherein the integration component is configured to determine that the data state of the memory cell did not change to the different data state responsive to the signal provided by the comparison component being in the active state and the capacitance being charged to less than the threshold amount.

8. The apparatus of claim 7, wherein the integration component is configured to determine that the data state of the memory cell did not change to the different data state responsive to the signal provided by the comparison component being in an inactive state.

9. An apparatus, comprising:
an array of resistance variable memory cells; and
an integration component that includes a select device, a capacitance, a constant voltage source, and a number of inverters to determine a data state of a memory cell based on an input from a comparison component, wherein:
the input from the comparison component is based on a determined change in resistance of a memory cell associated with a programming signal being provided to the array; and
the select device is configured to be selectively activated responsive to the input from the comparison component.

10. The apparatus of claim 9, wherein the integration component is configured to charge the capacitance at least a threshold amount when the input from the comparison component activates the select device for at least a threshold amount of time.

11. The apparatus of claim 10, wherein the integration component is configured to provide a signal having a first state in response to the capacitance being charged at least the threshold amount.

12. The apparatus of claim 11, wherein the signal having the first state corresponds to an indication that a data state of the memory cell is different than an initial data state of the memory cell.

13. The apparatus of claim 9, wherein the integration component is configured to charge the capacitance less than the threshold amount when the input from the comparison component activates the select device for less than the threshold amount of time.

14. The apparatus of claim 13, wherein the integration component is configured to provide the signal having a second state in response to the capacitance being charged less than the threshold amount.

15. The apparatus of claim 14, wherein the signal having the second state corresponds to an indication that the data state of the memory cell is the initial data state of the memory cell.

16. An apparatus, comprising:
an array of resistance variable memory cells;
a comparison component having a comparator to determine a change in resistance of a memory cell of the array responsive to a programming signal provided to the memory cell; and an integration component configured to charge a capacitance in response to an output of the comparison component indicating the change in the resistance of the memory cell responsive to the programming signal being provided to the memory cell, wherein the integration component indicates:
- the data state of the memory cell changed responsive to the programming signal being provided when the capacitance is not charged to at least a threshold amount; and
- the data state of the memory cell did not change responsive to the programming signal being provided when the capacitance is charged to less than a threshold amount.

17. An apparatus, comprising:
an array of memory cells; and
an integration component configured to determine a data state of a memory cell of the array responsive to determining whether a characteristic of a signal associated with a change in data state of the memory cell meets a particular threshold responsive to a programming signal being provided to the memory cell.

18. The apparatus of claim 17, wherein the integration component is configured to charge a capacitance for an amount of time that the characteristic occurred.

19. The apparatus of claim 18, wherein the capacitance is configured to store a charge that indicates the data state of the memory cell did not change responsive to the programming signal being provided if the capacitance was charged for an amount of time that is less than a threshold amount of time.

20. The apparatus of claim 18, wherein the capacitance is configured to store a charge that indicates the data state of the memory cell changed responsive to the programming signal being provided if the capacitance was charged for an amount of time that is greater than or equal to a threshold amount of time.

21. A method for sensing a resistance variable memory cell, comprising:
providing a programming signal to the memory cell,
determining whether a characteristic of a signal associated with a change in data state of the memory cell meets a particular threshold responsive to providing the programming signal to the memory cell; and
determining a data state of the memory cell responsive to whether the characteristic meets the particular threshold.

22. The method of claim 21, wherein determining the data state includes determining the data state changed from an initial data state to a different data state in response to providing the programming signal to the memory cell based on the characteristic of the signal occurring for at least a threshold amount of time.

23. The method of claim 21, wherein determining the data state includes determining the data state remains at an initial data state in response to providing the programming signal to the memory cell based on the characteristic of the signal occurring for less than a threshold amount of time.

* * * * *